(12) United States Patent
Ho et al.

(10) Patent No.: US 7,765,498 B1
(45) Date of Patent: Jul. 27, 2010

(54) METHODS OF INCORPORATING PROCESS-INDUCED LAYOUT DIMENSION CHANGES INTO AN INTEGRATED CIRCUIT SIMULATION NETLIST

(75) Inventors: Jonathan J. Ho, Fremont, CA (US); Yan Wang, Campbell, CA (US); Xin X. Wu, Fremont, CA (US); Jane W. Sowards, Fremont, CA (US)

(73) Assignee: XILINX, Inc., San Jose, CA (US)

( * ) Notice: Subject to any disclaimer, the term of this patent is extended or adjusted under 35 U.S.C. 154(b) by 478 days.

(21) Appl. No.: 11/805,739

(22) Filed: May 24, 2007

(51) Int. Cl.
*G06F 17/50* (2006.01)
(52) U.S. Cl. .................... 716/3; 716/7; 716/11
(58) Field of Classification Search ............. 716/3, 716/7, 11
See application file for complete search history.

(56) References Cited

U.S. PATENT DOCUMENTS

| | | | | |
|---|---|---|---|---|
| 6,311,316 B1 * | 10/2001 | Huggins et al. | ............... | 716/12 |
| 6,578,190 B2 * | 6/2003 | Ferguson et al. | ............... | 716/21 |
| 6,691,286 B1 * | 2/2004 | McElvain et al. | ............... | 716/3 |
| 6,721,938 B2 * | 4/2004 | Pierrat et al. | ................... | 716/19 |
| 7,082,588 B2 * | 7/2006 | Scheffer et al. | ................. | 716/8 |
| 7,441,211 B1 * | 10/2008 | Gupta et al. | .................... | 716/2 |
| 2004/0216065 A1 * | 10/2004 | Cobb et al. | ..................... | 716/8 |
| 2005/0044514 A1 * | 2/2005 | Wu et al. | ......................... | 716/5 |
| 2005/0076316 A1 * | 4/2005 | Pierrat et al. | ................... | 716/4 |
| 2005/0246675 A1 * | 11/2005 | Scheffer | ........................ | 716/8 |

* cited by examiner

*Primary Examiner*—Sun J Lin
(74) *Attorney, Agent, or Firm*—Lois D. Cartier; LeRoy D. Maunu

(57) ABSTRACT

Computer-implemented methods of generating netlists for use in post-layout simulation procedures. A lookup table includes a predetermined set of features (e.g., transistors of specified sizes and shapes) supported by an integrated circuit (IC) fabrication process, with dimensions and process induced dimension variations being included for each feature. A netlist is extracted from an IC layout, the extracted netlist specifying circuit elements (e.g., transistors) implemented by the IC layout and interconnections between the circuit elements. A search pattern is run on the IC layout to identify features in the IC layout corresponding to features included in the lookup table. Circuit elements in the extracted netlist that correspond to the identified features are then modified using values from the lookup table, and the modified netlist is output. In some embodiments, the netlist extraction, search pattern, and netlist modification are all performed as a single netlist generation step.

17 Claims, 5 Drawing Sheets

500

| TYPE | LMIN | LMAX | WMIN | WMAX | DIS MIN | DIS MAX | LPD MIN | LPD MAX | L2 MIN | L2 MAX | DL | DW |
|---|---|---|---|---|---|---|---|---|---|---|---|---|
| Poly Rounding | 70 | 150 | 120 | 150 | 50 | 70 | 20 | 60 | 90 | inf | 2 | 0 |
| Poly Rounding | 70 | 150 | 120 | 150 | 100 | 110 | 20 | 60 | 90 | inf | 1 | 0 |
| Poly Rounding | 70 | 150 | 120 | 150 | 100 | 110 | 60 | 120 | 90 | inf | 1.5 | 0 |
| ⋮ | | | | | | | | | | | | |
| Poly Rounding | 70 | 150 | 250 | 400 | 120 | 130 | 120 | inf | 90 | inf | 0.25 | 0 |
| Diffusion Rounding | 70 | 90 | 120 | 400 | 100 | 110 | 0 | 60 | 90 | inf | 0 | 1 |
| Diffusion Rounding | 70 | 90 | 120 | 400 | 100 | 110 | 60 | 120 | 90 | inf | 0 | 3 |
| Diffusion Rounding | 70 | 90 | 120 | 400 | 100 | 110 | 120 | inf | 90 | inf | 0 | 4 |
| ⋮ | | | | | | | | | | | | |
| Diffusion Rounding | 120 | 150 | 120 | 400 | 120 | 130 | 120 | inf | 90 | inf | 0 | 0.5 |

| TYPE | NP TYPE | VOLT TYPE | VT TYPE | L MIN | L MAX | W MIN | W MAX | SEP MIN | SEP MAX | DL | DW |
|---|---|---|---|---|---|---|---|---|---|---|---|
| Diffusion Iso-dens | All | All | All | 70 | inf | 120 | 400 | 200 | 350 | 0 | 1.5 |
| Diffusion Iso-dens | All | All | All | 70 | inf | 120 | 400 | 350 | 500 | 0 | 3 |
| Diffusion Iso-dens | All | All | All | 70 | inf | 120 | 400 | 500 | 800 | 0 | 4.5 |
| Diffusion Iso-dens | All | All | All | 70 | inf | 120 | 400 | 800 | inf | 0 | 6 |
| Poly Iso-dens | All | All | All | 70 | 90 | 200 | inf | 130 | 150 | -1.5 | 0 |
| Poly Iso-dens | All | All | All | 70 | 90 | 200 | inf | 700 | 1000 | 1.5 | 0 |
| Poly Iso-dens | All | All | All | 70 | 90 | 200 | inf | 1000 | inf | 2 | 0 |

FIG. 8

METHODS OF INCORPORATING PROCESS-INDUCED LAYOUT DIMENSION CHANGES INTO AN INTEGRATED CIRCUIT SIMULATION NETLIST

FIELD OF THE INVENTION

The invention relates to integrated circuit devices (ICs). More particularly, the invention relates to IC layouts and netlists, and methods of modifying the netlists to reflect behavioral changes resulting from semiconductor fabrication of the IC layouts.

BACKGROUND

Integrated circuits are typically manufactured using "layouts", which are collections of polygons and/or other shapes in two-dimensions. These polygons might be physically incorporated into "masks", with one or more masks being used to define the locations of each fabrication layer, e.g., diffusion, contacts, polysilicon (also known as "poly"), vias, metal 1, metal 2, and so forth. Alternatively or additionally, the polygons might form a database that is used to directly control the application of a layer to the surface of the wafer, without the use of a physical mask. In either case, the polygons define the areas of the polysilicon to which a new layer will be applied or from which an existing layer will be removed during the semiconductor fabrication process.

Although IC circuits are typically simulated prior to layout, it is desirable to simulate a circuit after layout as well, a process known as "post-layout simulation". Post-layout simulation provides a more accurate depiction of the circuit behavior than a simulation of the circuit prior to layout, and may detect, for example, discrepancies between the layout and the original circuit design. To perform a post-layout simulation, a netlist is extracted from the layout and the simulation is performed upon this netlist. The extracted netlist may include, for example, a specification of transistors implemented by the layout, interconnections between the transistors, width and length values for each transistor, parasitics for each transistor, and parasitic capacitances and resistances for the interconnections between the transistors.

However, the semiconductor fabrication process typically alters some characteristics of an IC layout, such as the length and/or width of transistors, and these effects become more pronounced for nanometer processes at smaller dimensions. It is common practice to account for this discrepancy during post-layout simulation by using complicated simulation models designed to predict the behavior of post-fabrication transistors. While these transistor models can be quite accurate, their development is time-consuming, and changes to the fabrication process typically require what may be extensive modification of each transistor model. Further, the use of these models complicates the simulation process to the point where post-layout simulation requires extensive amounts of time and computing power.

Therefore, it is desirable to find alternative computer-implemented methods of performing post-layout simulation that reduce the amount of time and computing-power required to perform post-layout simulation, while retaining a sufficient level of accuracy to provide confidence in the result.

SUMMARY

The invention provides computer-implemented methods of generating netlists for use in post-layout simulation procedures. In one embodiment, a lookup table includes a predetermined set of features (e.g., transistors of specified sizes and shapes) supported by an integrated circuit (IC) fabrication process, with dimensions and process induced dimension variations being included for each feature. A netlist is extracted from an IC layout, the extracted netlist specifying circuit elements (e.g., transistors) implemented by the IC layout and interconnections between the circuit elements. A search pattern is run on the IC layout to identify features in the IC layout corresponding to features included in the lookup table. Circuit elements in the extracted netlist that correspond to the identified features are then modified using values from the lookup table, and the modified netlist is output, e.g., to a user, to a file, or to a post-layout simulation tool.

According to another embodiment, the extracted netlist is generated with reference to the lookup table, rather than being modified after its initial generation. In this embodiment, a lookup table includes a predetermined set of features (e.g., transistors of specified sizes and shapes) supported by an IC fabrication process, with dimensions and process induced dimension variations being included for each feature. A netlist is extracted from an IC layout, where the extracted netlist includes a specification of circuit elements (e.g., transistors) implemented by the IC layout and connectivity information specifying interconnections between the circuit elements. The extracted netlist also includes effective dimensions for each circuit element implemented by the IC layout, the effective dimensions comprising actual dimensions taken from the IC layout modified by process induced dimension variations taken from the lookup table. The netlist is then output, e.g., to a user, to a file, or to a post-layout simulation tool.

The invention also provides media that store code for performing the methods of the invention.

Thus, the invention provides methods by which the frequent process modifications in advanced deep sub-micron development can be simulated during the design phase of an integrated circuit, before the IC is actually in production.

BRIEF DESCRIPTION OF THE DRAWINGS

The present invention is illustrated by way of example, and not by way of limitation, in the following figures.

FIG. 5 illustrates an exemplary lookup table that can be used, for example, in the method of FIG. 1, to compensate for corner rounding during fabrication.

FIG. 8 illustrates an exemplary lookup table that can be used, for example, in the method of FIG. 1, to compensate for pattern proximity effects during fabrication.

DETAILED DESCRIPTION OF THE DRAWINGS

While the specification concludes with claims defining some features of the invention that are regarded as novel, it is believed that the invention will be better understood from a consideration of the description in conjunction with the drawings. As required, specific embodiments of the present invention are disclosed herein. However, it is to be understood that the disclosed embodiments are merely exemplary of the invention, which can be embodied in various forms. Therefore, specific details disclosed herein are not to be interpreted as limiting, but merely as a basis for the claims and as a representative basis for teaching one skilled in the art to variously employ the inventive methods in virtually any appropriately detailed embodiment. Further, the terms and phrases used herein are not intended to be limiting, but rather to provide an understandable description of the invention.

Figure 1:
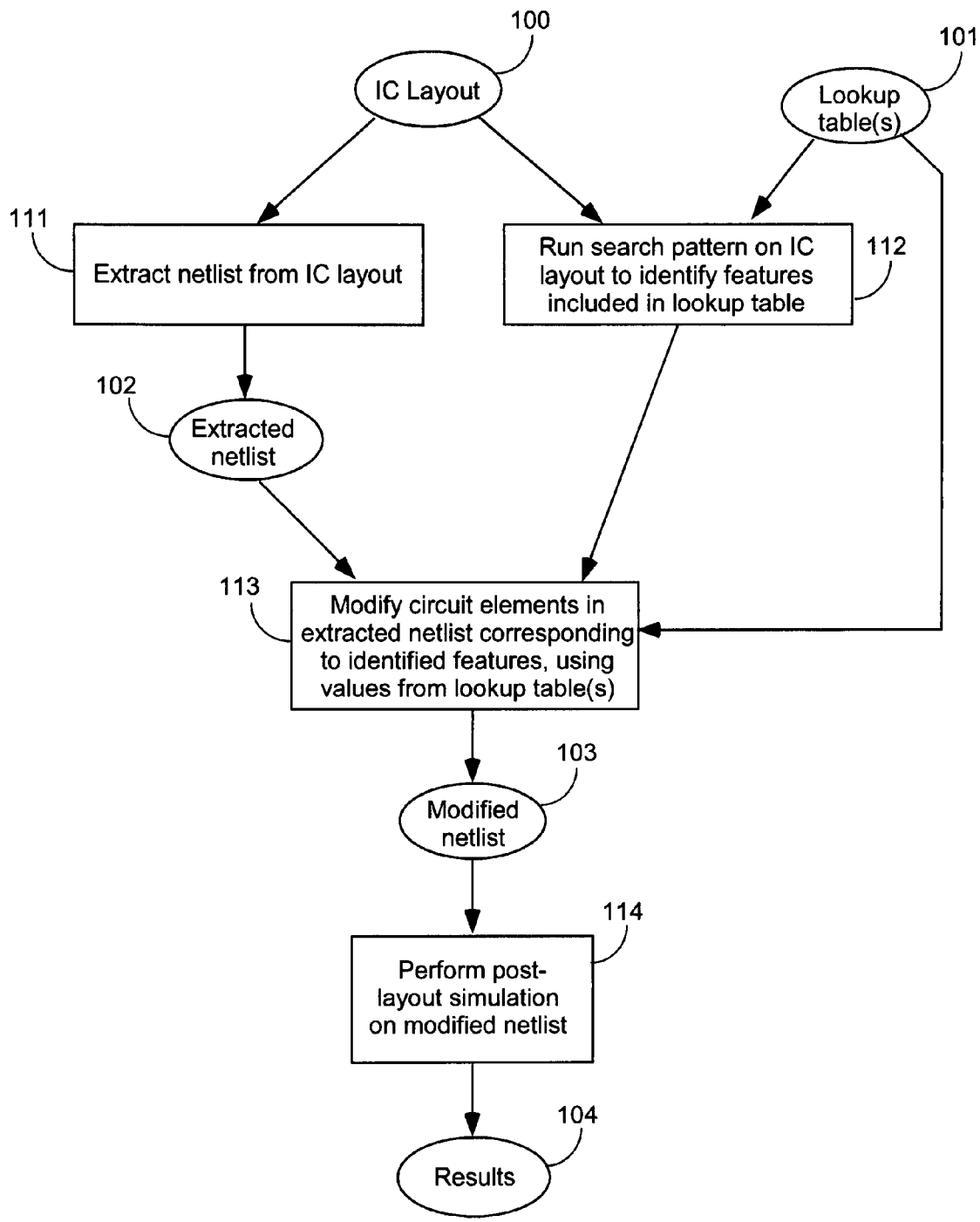
FIG. 1 illustrates the steps of a method of performing post-layout verification, according to embodiments of the present invention.

FIG. 1 illustrates the steps of a method of performing post-layout verification, according to embodiments of the present invention. Two computer files are used, an IC layout 100 and a lookup table 101. In some embodiments the IC layout 100 and/or lookup table 101 can be implemented as multiple files. The IC layout 100 can be a computer file representing a collection of polygons and/or other shapes in two-dimensions. These polygons and/or other shapes define fabrication layers for the IC, e.g., diffusion, contacts, polysilicon, vias, metal 1, metal 2, and so forth, and the fabrication layers determine the functionality of the IC. For example, where polysilicon and diffusion overlap, a transistor is formed. If the diffusion is of a first type, the transistor is an N-type transistor. If the diffusion is of a second type, the transistor is a P-type transistor.

Figure 2:
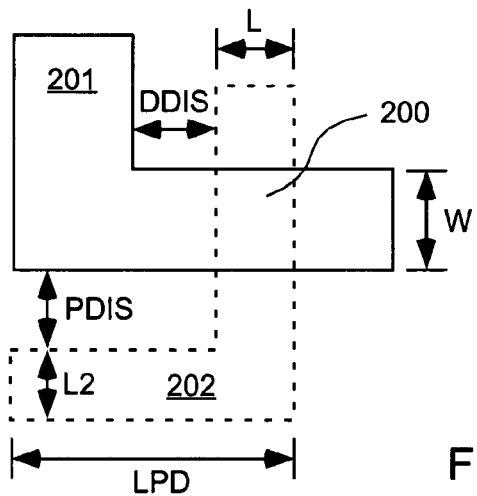
FIG. 2 illustrates a transistor in an integrated circuit (IC) layout.

The lookup table 101 is a second computer file that includes a predetermined set of features supported by an IC fabrication process, with dimensions and process induced dimension variations being included for each feature. For example, the lookup table might include an entry for a feature comprising a certain size and shape of transistor, as shown in FIG. 2, e.g., an L-shaped piece of polysilicon 202, with one leg of the L-shape overlapping with diffusion 201 to form transistor 200. The specified dimensions might include a length for transistor 200 (e.g., the width L of the polysilicon in the gate area), a width for transistor 200 (e.g., the width W of the diffusion in the gate area), a distance DDIS between the diffusion and a parallel edge of the polysilicon, a distance PDIS between the polysilicon and a parallel edge of the diffusion, a length LPD of the other leg of the L-shaped piece of polysilicon, and a width L2 of the other leg of the L-shaped piece of polysilicon. In one embodiment, each of the specified dimensions is a factor that can influence the operating characteristics and/or performance of transistor 200.

Figure 3:
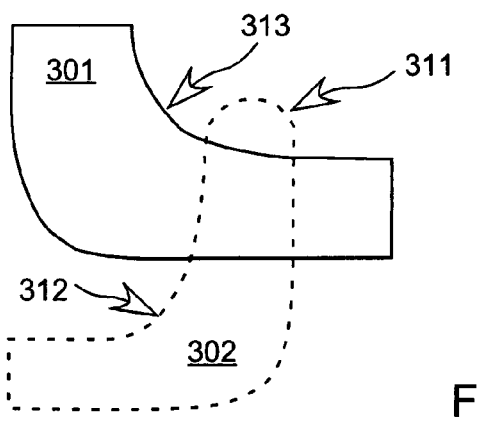
FIG. 3 illustrates the transistor of FIG. 2 after undergoing a semiconductor fabrication process.

The various dimensions illustrated in FIG. 2 may affect the operating characteristics and/or performance of the transistor, because the dimensions of the polygons in the IC layout do not translate perfectly to the silicon. For example, corners are typically rounded off during the semiconductor fabrication process, e.g., as shown in FIG. 3. This effect is referred to herein as "corner rounding". Common corner rounding effects that can affect operating characteristics and/or performance include, for example, rounding off 312 on interior corners of polysilicon 302, effectively increasing the length of the transistor and reducing its current drive strength, and rounding off 313 on interior corners of diffusion 301, effectively increasing the width of the transistor and increasing its current drive strength. Another possible effect is line end shortening, where the rounding off 311 of the end cap of polysilicon 302 may actually reduce the length of the transistor at the end nearest the end cap.

Returning now to FIG. 1, in step 111 a netlist 102 is extracted from the IC layout 100. The netlist extraction procedure is well known, and can be performed, for example, using any of several commercially available computer aided design (CAD) tools. During netlist extraction, an IC layout is processed on a computer to identify transistors (i.e., areas where polysilicon and diffusion overlap), and to extract information as to the interconnectivity between the transistors. This information is written to a computer file, i.e., the extracted netlist 102. Typically, a length and width for each transistor are also determined from the drawn layout dimension and recorded in the computer file, as are perimeter and area measurements for the source and drain of each transistor. Parasitic capacitance and resistance values for the interconnect may also be extracted and recorded in the computer file. Thus, the extracted netlist 102 comprises a description of the circuit implemented by the IC layout 100, and the information in the netlist provides additional data that can be used to predict performance and other operating characteristics for the transistors in the circuit. The extracted netlist is in one sense an "ideal" netlist, in that it describes the layout as if the fabrication process had no effect on the dimensions and other characteristics of the various design elements.

In step 112, a search pattern is run on the IC layout to identify certain features in the layout. Specifically, the search pattern identifies features of the IC layout that correspond to features included in the lookup table. In one embodiment, for a feature of the IC layout to be identified with a feature in the lookup table, all specified dimensions (e.g., L, W, PDIS, DDIS, LPD, and L2) must correspond exactly. In other embodiments, some or all of the specified dimensions can fall within a range, must exceed a minimum value, or must not exceed a maximum value, for the feature to be identified. It will be clear to those of skill in the art that the requirements for feature identification can vary and are easily modified to suit a particular application or fabrication process. Step 112 can be performed before, after, and/or concurrently with step 111.

In step 113, circuit elements of the extracted netlist 102 corresponding to features identified in step 112 are modified. For example, in addition to layout dimensions for each feature, the lookup table 101 includes process induced dimension variations for each feature, as is now described.

Figure 4:
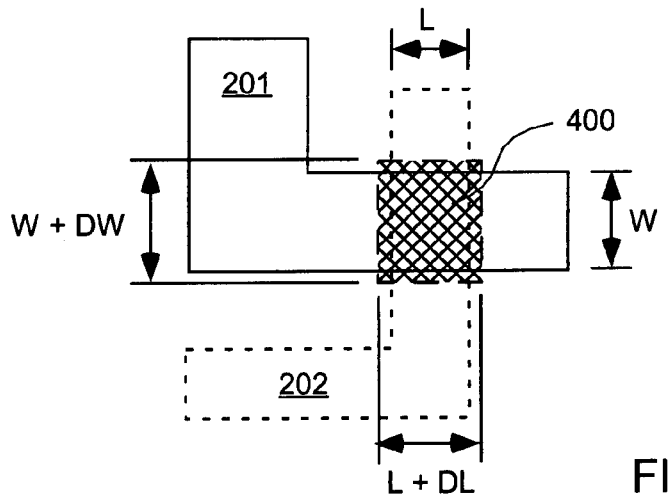
FIG. 4 illustrates a virtual transistor that may be used to model the transistor of FIG. 3.

In this embodiment, it has already been determined that after fabrication the IC layout feature of FIG. 2 will actually appear as shown in FIG. 3. Also, prior testing and/or careful simulation has established that the fabricated transistor of FIG. 3 can be modeled with acceptable accuracy (in one embodiment, within a few percent) by a transistor 400 having a slightly larger width and length than transistor 200 of FIG. 2; e.g., as shown in FIG. 4. Therefore, in step 113 the circuit element in the extracted netlist that corresponds to this transistor is modified to reflect a larger length (length "L" is replaced by "L+DL") and a larger width (width "W" is replaced by "W+DW"). The values of DL and DW are taken from the lookup table 101.

Note that the values DL and DW can be included in the lookup table in various forms. For example, the "delta values" DL and DW can be replacement values for the original value, numbers to be added to the original values, numbers to be subtracted from the original values, a multiplication factor (greater than or less than one) for the original values, by some other method, or by a combination of these methods. Further, some features may specify modifications to only the length or only the width of a transistor. Some features can modify characteristics other than width and length, such as mobility and threshold voltage, for example. Also, note that in some lookup tables the delta value may cause one or more dimensions of a feature in the IC layout to be decreased, rather than increased.

As has been explained, in step 113 circuit elements of the extracted netlist 102 are modified according to values included in one or more lookup tables 101. The result is a modified netlist 103, which includes the same circuit elements and the same interconnections between the circuit elements as the extracted netlist 102. However, the dimensions of one or more circuit elements are different. Note that some features in the extracted netlist may be modified while other features are not modified, due to different configurations, sizes, transistor types, original dimensions, and so forth.

In step 114, a post-layout simulation is performed using the modified netlist 103. The modified netlist 103 more accurately reflects the behavior of the fabricated IC than would a similar simulation based on the extracted netlist 102. Moreover, while the accuracy of the simulation results is not as great as the accuracy of a detailed simulation based on a detailed model of each fabricated transistor, the amount of time, computer memory, and computing power required to perform the simulation may be much less than when the known methods are used.

FIG. 5 illustrates a first exemplary lookup table 500, which compensates for corner rounding effects during IC fabrication. This lookup table can be used, for example, in the method of FIG. 1. Dimensions specified in the exemplary tables herein are specified in nanometers (nm). The numbers in the tables herein are purely exemplary, and are not intended to be limiting.

The amount of corner rounding that may occur to a transistor, e.g., between the embodiments of FIGS. 2 and 3, can be a function of the values PDIS, DDIS, LPD, and L2 (see FIG. 2). Thus, lookup table 500 includes entries for the dimensions L and W (to define the initial size of the transistor), and entries for the dimensions PDIS, DDIS, and LPD (to determine the amount of rounding that is expected to occur during fabrication). Dimensions in the lookup table can include fixed values, ranges of values, or some fixed and some ranges of values. Lookup table 500 specifies ranges of values for each of dimensions L, W, DIS (which represents the dimension PDIS for poly rounding and DDIS for diffusion rounding), LPD, and L2. Lookup table 500 also specifies delta values DL and DW for each feature in the lookup table.

Note that each feature in the IC layout may have multiple entries in the lookup table. For example, a transistor may be subject to both poly rounding and diffusion rounding. For example, referring to FIG. 5, a transistor having a length L of 70 nm, a width W of 120 nm, a poly distance of 50 nm, a diffusion distance of 100 nm, a poly leg extension LPD of 60 nm, and a poly leg width L2 of 90 nm, would be subject to two dimension adjustments. A poly rounding effect would dictate an increase in the length of 2 nanometers, while a diffusion rounding effect would dictate an increase in the width of 1 nanometer. In this example, there is only one modification to the length, and one modification to the width. However, in other embodiments there can be multiple modifications to the same dimension, and the modifications may act in concert with one another or may act to cancel one another partially or fully.

The lookup table of FIG. 5 could easily be divided into two lookup tables, for example, with one lookup table including dimension variations for poly rounding, and another lookup table including dimension variations for diffusion rounding. In either case, changes to the fabrication process are easily accommodated by making straightforward alterations to the one or more lookup tables. The ease of this approach may be favorably compared with the known methods of generating post-layout netlists, which would require the regeneration of complicated behavioral models for each type and size of transistor for each change in the fabrication process.

In lookup table 500, minimum dimensions (LMIN, WMIN, DISMIN, LPDMIN, and L2MIN) may be fixed according to the capabilities of the semiconductor fabrication process being used to manufacture the IC. For maximum dimensions (LMAX, WMAX, DISMAX, LPDMAX, and L2MAX), a value of "inf" (infinity) may be included in the table, indicating that there is no upper range to the dimension.

Figure 6:
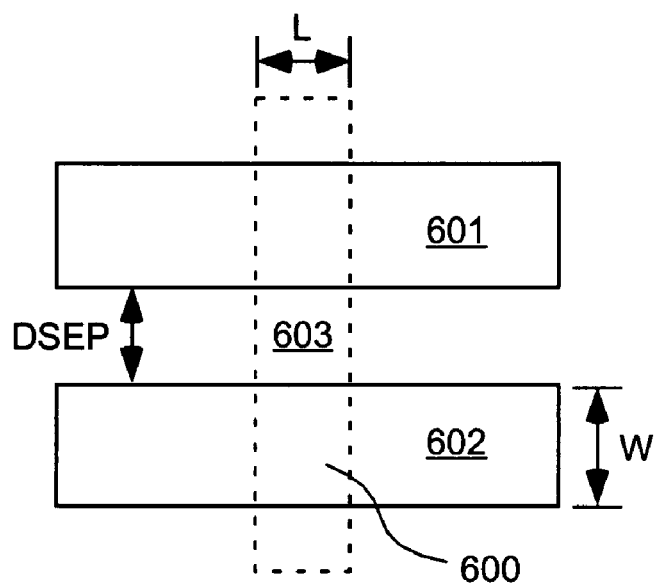
FIG. 6 illustrates transistors in an IC and provides an example of a diffusion-to-diffusion spacing that can affect the dimensions of the transistors after fabrication.

Another type of effect that can be compensated for by using the method of FIG. 1 is the pattern proximity effect, sometimes referred to as the "iso-dens" effect. The pattern proximity effect can apply, for example, to diffusion or polysilicon that forms two transistors in relatively close proximity to one another. For example, FIG. 6 shows a portion of an IC layout that includes a transistor 600 formed by an intersection of diffusion 602 and polysilicon 603. When transistor 600 lies within a separation distance DSEP of another piece of diffusion 601, the separation distance may alter the operating characteristics and/or performance of the transistor 600. Typically, a relatively larger separation may cause the width W of transistor 600 to increase by a greater amount during fabrication than a smaller separation.

Figure 7:
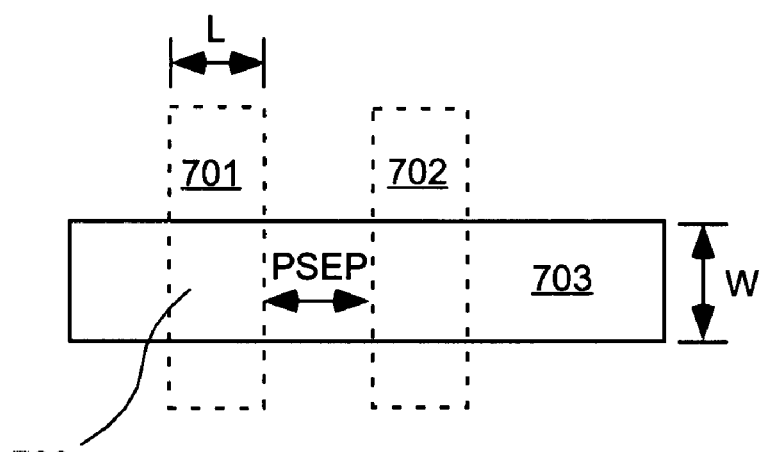
FIG. 7 illustrates transistors in an IC and provides an example of a poly-to-poly spacing that can affect the dimensions of the transistors after fabrication.

The length L of a transistor is not affected by diffusion pattern proximity effects, but may be affected by polysilicon pattern proximity effects, as shown in FIG. 7. FIG. 7 shows a portion of an IC layout that includes a transistor 700 formed by an intersection of diffusion 703 and polysilicon 701. When transistor 700 lies within a separation distance PSEP of another piece of polysilicon 702, the separation distance may alter the operating characteristics and/or performance of the transistor 700. Typically, a relatively larger separation may cause the length L of transistor 700 to increase during fabrication more than a smaller separation, while a relatively smaller separation may actually cause the length L to decrease.

FIG. 8 illustrates a second exemplary lookup table 800, which compensates for pattern proximity effects during IC fabrication. This lookup table can be used, for example, in the method of FIG. 1, alone or in conjunction with one or more other lookup tables, e.g., with the lookup table of FIG. 5.

The effects of pattern proximity can be, for example, a function of the values DSEP and PSEP (see FIGS. 6 and 7, respectively). Thus, lookup table 800 includes entries for the dimensions L and W (to define the initial size of the transistor), and entries for the dimensions DSEP and PSEP (to specify the effects of pattern proximity during fabrication). Also included may be such other factors as the type of the transistor (e.g., N-type or P-type), voltage type (e.g., the power high voltage that may be applied to the transistor), oxide thickness types, and VT type (e.g., the threshold voltage of the transistor). In exemplary lookup table 800, all table entries apply to all transistor types, voltage types, oxide thickness types, and threshold voltage types. However, in other embodiments differences in one or more of these factors may cause a transistor to respond differently to the fabrication process, i.e., to require separate entries and different delta values in the lookup table.

Dimensions in the lookup table can include fixed values, ranges of values, or some of fixed and some ranges of values. Lookup table 800 specifies ranges of values for each of dimensions L, W, and SEP (which represents the dimension PSEP for polysilicon pattern proximity and DSEP for diffusion pattern proximity). Lookup table 800 also specifies delta values DL and DW for each entry in the lookup table.

Note that each feature in the IC layout may have multiple entries in the lookup table. For example, a transistor may be subject to both polysilicon pattern proximity and diffusion pattern proximity effects. For example, a transistor having a length L of 70 nm, a width W of 200 nm, a poly separation of 150 nm, and a diffusion separation of 200 nm would be subject to two dimension adjustments. A polysilicon pattern proximity effect would dictate a decrease in the length of 1.5 nanometers, while a diffusion pattern proximity effect would dictate an increase in the width of 1.5 nanometers.

Some features in an IC layout may not need some types of dimension adjustment, and these features may be omitted from one or more lookup tables, if desired. For example, lookup table 800 of FIG. 8 does not include "Poly Iso-dens" (polysilicon iso-dens or pattern proximity effect) entries for polysilicon having a separation of 150 to 700 nanometers, because the fabricated separation is within acceptable limits of the drawn separation for the polysilicon. Therefore, no dimension adjustment is necessary for the exemplary fabrication process.

The lookup table of FIG. 8 could easily be divided into two lookup tables, for example, with one lookup table including dimension variations for polysilicon pattern proximity effects, and another lookup table including dimension variations for diffusion pattern proximity effects. In either case, changes to the fabrication process are easily accommodated by making straightforward alterations to the lookup table. The ease of this approach may be favorably compared with the known methods of generating post-layout netlists, which would require the regeneration of complicated behavioral models for each type and size of transistor.

Note that the method of FIG. 1 can easily accommodate the application of both lookup tables 500 (FIG. 5) and 800 (FIG. 8).

In lookup table 800, minimum dimensions are typically fixed according to the capabilities of the semiconductor fabrication process being used to manufacture the IC. Maximum dimensions may be fixed on the same basis, or, in some cases, a value of "inf" is included in the table, indicating that there is no upper range to the dimension.

The exemplary lookup tables described herein provide dimension adjustment as a result of corner rounding of diffusion and/or polysilicon, and/or as a result of pattern proximity effects for diffusion and/or polysilicon. However, it will be clear to those of skill in the art that the methods of the invention are not limited to these effects, but can be extended to cover other variation effects, additionally or alternatively. For example, another effect that can be compensated for by using the methods of the invention is mechanical stress to current conduction channels in transistors. As is well known, this mechanical stress (and therefore the current conduction of the transistors) varies based on the poly-to-poly spacing between parallel transistors. The mechanical stress can also vary based on the technique used to mitigate the stress, e.g., stress material that covers the entire diffusion and polysilicon area, or stress material that covers only the diffusion areas between the polysilicon. Thus, these factors can be included in a lookup table and compensated for by adjusting the dimensions or other characteristics of the transistors in the netlist.

Further, the exemplary lookup tables address variations in width and length of transistors. However, in some embodiments, some or all of the features in the lookup table are structures other than transistors. For example, features in the lookup table can include capacitors, resistors, inductors, and so forth. However, features in the lookup table preferably only include features that can be automatically detected by the search pattern software utilized in step 112 (see FIG. 1).

Additionally, the exemplary lookup tables address only dimensional variations, e.g., variations in width and/or length. However, other characteristics of the features in the tables can be addressed instead of or in addition to dimensional variations, such as mobility and/or threshold voltage, for example. Other characteristics, that can be compensated for, could include, for example, the parasitic capacitance and resistance values for the interconnect.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suitable. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

This invention can be embodied in other forms without departing from the spirit or essential attributes thereof. Accordingly, reference should be made to the following claims, rather than to the foregoing specification, as indicating the scope of the invention. Note that claims listing steps do not imply any order of the steps.

What is claimed is:

1. A computer-implemented method, comprising:
inputting a lookup table comprising, for a predetermined set of features supported by an integrated circuit (IC) fabrication process, dimensions and process induced dimension variations for each feature;
inputting an IC layout;
extracting a netlist from the IC layout, the extracted netlist specifying circuit elements implemented by the IC layout and further specifying interconnections between the circuit elements;
running a search pattern on the IC layout to identify features in the IC layout corresponding to the features included in the lookup table;
modifying, by a computer, dimensions of one or more of the circuit elements in the extracted netlist corresponding to the identified features using values of dimensions and process induced dimension variations from the lookup table, wherein a modified netlist is generated;
performing a post-layout simulation of the modified netlist, wherein the post-layout simulation simulates behavior of an IC fabricated with the modified netlist; and
outputting results of the post-layout simulation.

2. The method of claim 1, wherein:
the predetermined set of features comprises at least one transistor;
the dimensions included in the lookup table include a length of the at least one transistor; and
the process induced dimension variations in the lookup table include a modification to the length of the at least one transistor.

3. The method of claim 2, wherein the modifying the circuit elements in the extracted netlist comprises, for at least one circuit element corresponding to the at least one transistor, replacing the length of the at least one transistor by a larger effective length.

4. The method of claim 1, wherein:
the predetermined set of features comprises at least one transistor;
the dimensions included in the lookup table include a width of the at least one transistor; and
the process induced dimension variations in the lookup table include a modification to the width of the at least one transistor.

5. The method of claim 4, wherein the modifying the circuit elements in the extracted netlist comprises, for at least one circuit element corresponding to the at least one transistor, replacing the width of the at least one transistor by a larger effective width.

6. The method of claim 1, wherein the dimensions include length and width dimensions for each feature in the lookup table.

7. An article of manufacture, comprising:
a computer-readable storage medium comprising:
a lookup table comprising, for a predetermined set of features supported by an IC fabrication process, dimensions and process induced dimension variations for each feature; and
computer-executable code for generating a modified netlist of an integrated circuit (IC) layout, the computer-executable code comprising instructions that when executed by a computer cause the computer to perform operations including:
extracting a netlist from the IC layout, the extracted netlist specifying circuit elements implemented by the IC layout and further specifying interconnections between the circuit elements;
running a search pattern on the IC layout to identify features in the IC layout corresponding to the features included in the lookup table;
modifying dimensions of one or more of the circuit elements of the extracted netlist corresponding to the identified features using values of dimensions and process induced dimension variations from the lookup table, wherein a modified netlist is generated;
performing a post-layout simulation of the modified netlist, wherein the post-layout simulation simulates behavior of an IC fabricated with the modified netlist; and
outputting results of the post-layout simulation.

8. The article of manufacture of claim 7, wherein the medium further comprises the IC layout.

9. The article of manufacture of claim 8, wherein the lookup table comprises a plurality of computer files.

10. The article of manufacture of claim 7, wherein the modifying the circuit elements of the extracted netlist comprises modifying a length of at least one circuit element in the extracted netlist.

11. The article of manufacture of claim 7, wherein the modifying the circuit elements of the extracted netlist comprises modifying a width of at least one circuit element in the extracted netlist.

12. A computer-implemented method, comprising:
inputting a lookup table comprising, for a predetermined set of features supported by an integrated circuit (IC) fabrication process, dimensions and process induced dimension variations for each feature;
inputting an IC layout;
extracting a netlist from the IC layout, wherein the extracted netlist comprises:
a specification of a plurality of circuit elements implemented by the IC layout,
connectivity information specifying interconnections between the circuit elements, and
actual dimensions for each circuit element taken from the IC layout;
modifying, by a computer, the actual dimensions in the extracted netlist using process induced dimension variations taken from the lookup table to generate a modified netlist;
performing a post-layout simulation of the modified netlist, wherein the post-layout simulation simulates behavior of an IC fabricated with the modified netlist; and
outputting results of the post-layout simulation.

13. The method of claim 12, wherein the extracting a netlist comprises running a search pattern on the IC layout to identify the features in the IC layout corresponding to features included in the lookup table.

14. The method of claim 12, wherein:
the predetermined set of features comprises at least one transistor;
the dimensions included in the lookup table include a length of the at least one transistor; and
the process induced dimension variations in the lookup table include a modification to the length of the at least one transistor.

15. The method of claim 14, wherein the modification to the length of the at least one transistor comprises an increase in the length of the at least one transistor.

16. The method of claim 12, wherein:
the predetermined set of features comprises at least one transistor;
the dimensions included in the lookup table include a width of the at least one transistor; and
the process induced dimension variations in the lookup table include a modification to the width of the at least one transistor.

17. The method of claim 16, wherein the modification to the width of the at least one transistor comprises an increase in the width of the at least one transistor.

* * * * *